(12) United States Patent
McWilliams et al.

(10) Patent No.: US 8,816,719 B2
(45) Date of Patent: Aug. 26, 2014

(54) RE-PROGRAMMABLE ANTIFUSE FPGA UTILIZING RESISTIVE CERAM ELEMENTS

(71) Applicant: Symetrix Corporation, Colorado Springs, CO (US)

(72) Inventors: Christopher Randolph McWilliams, Colorado Springs, CO (US); Carlos A. Paz de Araujo, Colorado Springs, CO (US); Jolanta Celinska, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 6 days.

(21) Appl. No.: 13/871,918

(22) Filed: Apr. 26, 2013

(65) Prior Publication Data

US 2013/0285699 A1 Oct. 31, 2013

Related U.S. Application Data

(60) Provisional application No. 61/638,932, filed on Apr. 26, 2012.

(51) Int. Cl.

| H03K 19/177 | (2006.01) |
| H01L 25/00 | (2006.01) |
| G11C 17/18 | (2006.01) |
| H01L 45/00 | (2006.01) |
| H03K 19/173 | (2006.01) |
| G11C 17/16 | (2006.01) |

(52) U.S. Cl.
CPC .............. *H03K 19/173* (2013.01); *G11C 17/18* (2013.01); *H03K 19/1778* (2013.01); *H01L 45/146* (2013.01); *G11C 17/16* (2013.01)
USPC .................... 326/41; 326/38; 326/39; 326/47

(58) Field of Classification Search
None
See application file for complete search history.

(56) References Cited

U.S. PATENT DOCUMENTS

| 7,872,900 | B2 | 1/2011 | Paz de Araujo et al. | |
| 8,497,703 | B2 * | 7/2013 | Kim et al. | 326/39 |
| 2010/0079165 | A1 * | 4/2010 | Bertin et al. | 326/38 |

OTHER PUBLICATIONS

McWilliams et al.; "Device characterization of correlated electron random access memories"; *Journal of Applied Physics*, May 13, 2011; 109(9):091608-091608-6.
McWilliams et al.; "Re-Programmable Antifuse FPGA Utilizing Resistive CeRAM Elements"; *Integrated Ferroelectrics*, Jun. 27, 2011; 124(1):97-104.

* cited by examiner

*Primary Examiner* — Anh Tran
(74) *Attorney, Agent, or Firm* — Squire Patton Boggs (US) LLP

(57) ABSTRACT

A re-programmable antifuse field programmable gate array (FPGA) integrated circuit, the FPGA comprising: a plurality of CeRAM resistive switching elements forming a connection block, the switching elements capable of being switched from a conductive (ON) state to a non-conductive (OFF) state and back to a conductive (ON) state; a plurality of logic elements forming a logic block; and a programming circuit for turning the CeRAM switching elements OFF and ON to connect the logic elements to form the FPGA.

28 Claims, 7 Drawing Sheets

RE-PROGRAMMABLE ANTIFUSE FPGA UTILIZING RESISTIVE CERAM ELEMENTS

BACKGROUND

1. Field of the Invention

The embodiments disclosed herein relate to the field of integrated circuit memories, and in particular to antifuse field programmable gate arrays (FPGAs).

2. Description of the Related Art

It is known that it is desirable to make integrated circuit devices smaller, such as integrated circuit memories, as smaller devices tend to operate faster with lower current. However, when complementary metal-oxide semiconductor (CMOS) technologies are scaled down to the nanometer range, transistor yields decrease and the feat of achieving 100% yield is hardly ever accomplished. Because of this decrease in yield, it is desirable to be able to reconfigure the circuit around bad devices.

Over the last several years, extensive efforts have gone into the development and research of devices based on resistance change. However, no resistance change memories are yet presently commercially available.

BRIEF DESCRIPTION OF THE DRAWINGS

The invention will become clearly understood from the following detailed description read together with the drawings in which.

DETAILED DESCRIPTION OF EMBODIMENTS

I. General

Embodiments described herein include CeRAM switches and memories. They are referred to as "CeRAM" based on the strong electron correlation observed in such material, and, in particular, a metal-insulator-metal (MIM) structure formed here with Pt/NiO/Pt, i.e., as a layer including nickel oxide (NiO) between platinum (Pt) electrodes. The integrated circuit switches and memories described in embodiments herein have simple operation, properties that improve as they are scaling smaller, CMOS compatibility, and a straightforward path to 3D architectures. Although resistance switching properties have been observed in a variety of materials, embodiments described herein using NiO and other suitable transition oxides, such as described in U.S. Pat. No. 7,872,900 titled "Correlated Electron Memory" issued Jan. 18, 2011, to Carlos A. Paz de Araujo, Jolanta Celinska, and Matthew D. Brubaker, have advantages due to its uni-directional programmability for simplified cross-point array structures and the industry trend of using nickel silicide contacts in advanced technology nodes. By utilizing CeRAM structures in the routing resources and as the block memory, which account for roughly 80% of the total area of a traditional architecture, it is possible to significantly reduce the size of the array while maintaining the use of existing low power logic styles.

In this disclosure, the term "above" in reference to position in an integrated circuit formed on a semiconducting substrate means that the position is farther from the substrate, and the term "below" means that the structure that is below is closer to the substrate. In this disclosure, metal/insulator/metal, abbreviated MIM, refers to a structure in which an insulating material or a material that can be switched between an insulating and a conductive state is sandwiched between a pair of conducting layers. The conducting layers may be referred to as "electrodes."

Figure 1:
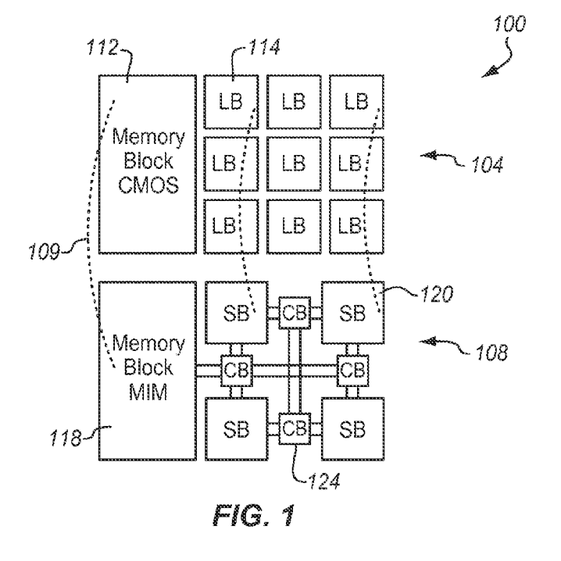
FIG. 1 is a block representation of an embodiment of an FPGA with routing resources above the logic.
Figure 2:
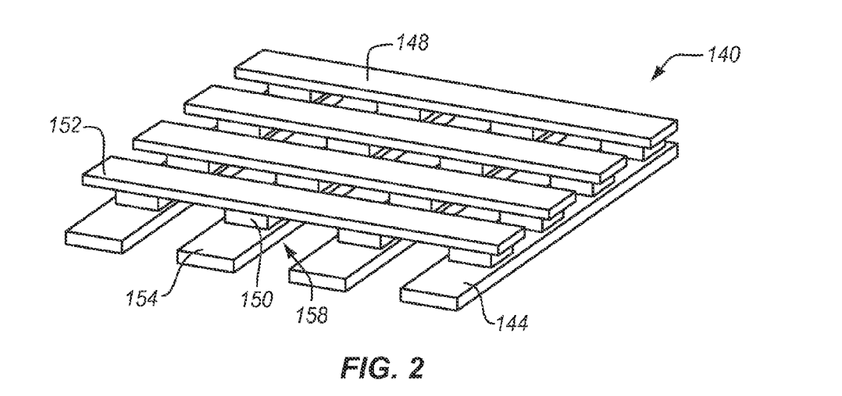
FIG. 2 is an embodiment of a crossbar structure.

FIG. 1 shows a block level representation of one embodiment of a memory 100. Memory embodiment 100 includes a CeRAM module 108 and a logic module 104. The CeRAM module 108 lies on top of the logic module 104 as shown by the dotted lines 109. In one embodiment, logic module 104 includes logic blocks (LB), such as 114, and CMOS memory block 112. CeRAM module 108 includes metal/insulator/metal (MIM) memory block 118, switch blocks (SB), such as 120, and connection blocks (CB), such as 124. A CeRAM memory block, such as 118, in a 1T1R (1-transistor, 1-resistor) circuit configuration, which is roughly the size of one transistor, for the memory blocks as a replacement for traditional 6T (6-transistor) SRAM could yield a density enhancement of roughly five to six times the existing architecture. As will be seen in more detail below, one embodiment of the structure comprises a field programmable gate array (FPGA). In one embodiment, the routing resources of an FPGA consist of switch blocks (SB), connection blocks (CB), and interconnects. The logic blocks (LB) and memory blocks connect to the routing channels through CBs, and the CBs connect to the SBs to make up the global routing channels. Traditionally, the CBs consist of pass transistors with 6T SRAM elements to determine if the pass transistors are to be ON or OFF or one time programmable antifuse elements. The proposed architecture in one embodiment would consist of a single CeRAM element with arrays structured in a crossbar configuration (FIG. 2). Modern prior art SB design also utilizes pass transistors and 6T SRAM elements. The architecture embodiments described herein would replace the pass transistor and SRAM with a single CeRAM element, reducing each switch from 7-transistors to 1-resistor.

FIG. 2 illustrates an embodiment 140 of a crossbar structure. This embodiment includes metal lines, such as 148, placed perpendicular to and on top of metal lines, such as 144. In this disclosure, the term "metal" when used in the context of an integrated circuit may mean a metal material, but, as is traditional in the art, may also mean a conductive material, such as polysilicon. A resistive memory element, such as 158, is formed at the juncture of each upper conductor and lower conductor by a CeRAM layer, such as 150, disposed between upper conductor 152 and lower conductor 154.

Figure 3:
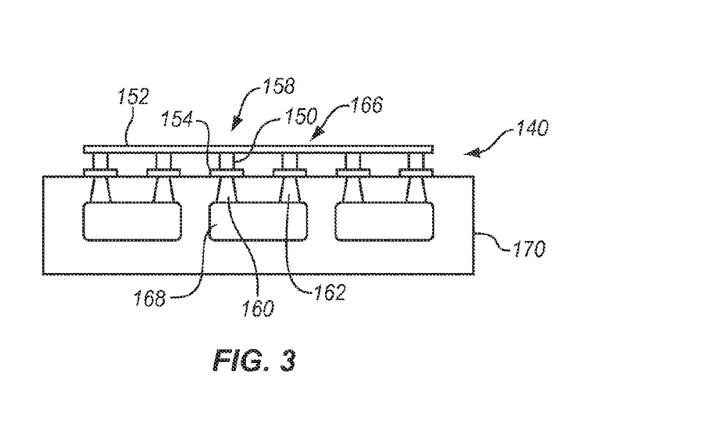
FIG. 3 is an embodiment of a crossbar structure integrated with a CMOS logic layer.

FIG. 3 is a cross-sectional view of an embodiment of a crossbar structure 140 integrated with a CMOS logic layer 170. Each CeRAM resistive cell, such as 158, is connected to a CMOS device, such as 160, by a plug, such as 160. In this embodiment, two plugs, such as 160 and 162, connect a pair of CeRAM cells, 158 and 166, to the CMOS device 168.

II. CeRAM Switch

Figure 4:
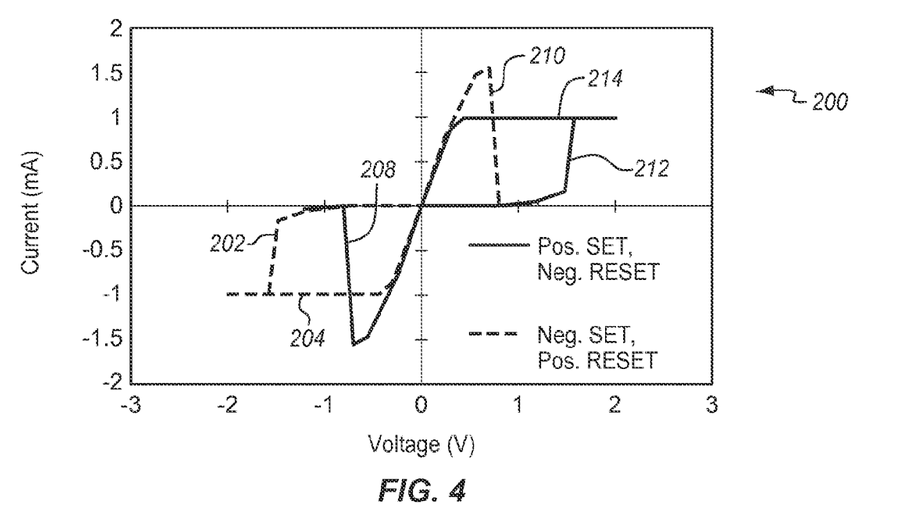
FIG. 4 shows an example of switching behavior for a CeRAM bipolar switch.
Figure 5:
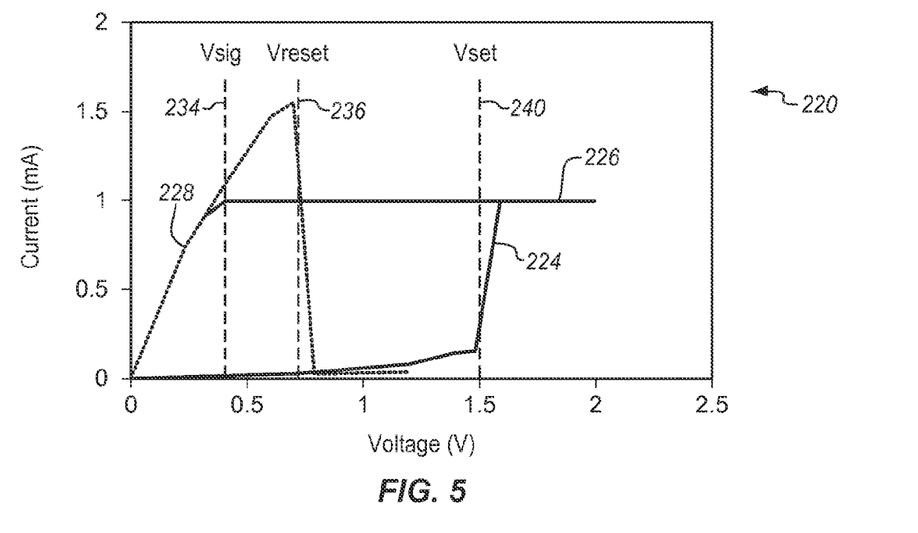
FIG. 5 shows an example of switching behavior for a CeRAM unipolar switch.

In one embodiment, CeRAM is a resistive memory based on a Mott-like charge transfer in transition metal oxides or perovskite. Strong electron correlations exist in the bulk phase of such materials as described by Mott and Hubbard. In the case of ultra thin films, compensation of charge effects in the large surface-to-volume ratio is achieved resulting in a reliable device. In this embodiment, a large change in the devices resistance between "On" and "Off" states occurs. CeRAM devices exhibit bi-stable switching behaviors and can be programmed with either bipolar (FIG. 4) or unipolar (FIG. 5) switching methods. In FIG. 4, the dotted line 202 is a negative SET sweep while the positive part of this sweep, i.e. 210, is a positive RESET sweep. The negative part of the solid line 208 is a negative RESET, and the positive part 212 is a positive SET sweep. In the unipolar switching mode of FIG. 5, the dotted line 228 shows the RESET sweep while the solid line 224 shows the SET sweep. The SET voltage Vset is shown at 240, the RESET voltage is shown at 234, and the voltage of an exemplary safe, non-disturb read pulse, Vsig, is shown at 236. Vreset is the voltage at which the switch is turned from ON to OFF, and Vset is the voltage at which the switch is turned from OFF to ON. An important aspect of these switching curves is the leveling off of the SET voltage at 204, 214, and 226. This leveling is due to saturation of the transistors through which power is applied to the system, which will be discussed in connection with FIGS. 8-11 below. This saturation of the transistors prevents the SET voltage from rising so high that the integrated circuit could be damaged. An appropriately configured device exhibits hysteresis and non-volatile characteristics for which stable memory switching can be controlled. Such stable systems based on CeRAM are ideally suited as routing elements in an antifuse type architecture FPGA. A more detailed description of the parametric and functional behavior of the CeRAM switch elements can be found in C. McWilliams, J. Celinska, C. A. Paz de Araujo, and K.-H. Xue, *J. Appl. Physics*, 109, 091608 (2011); DOI: 10.1063/1.3581206.

Figure 6:
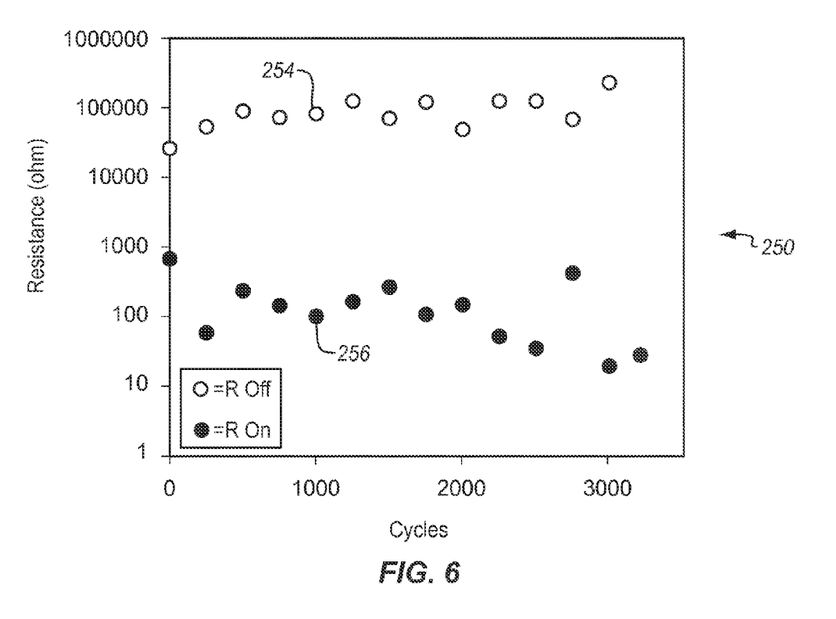
FIG. 6 shows an example of a graph of resistance as a function of programming cycles for a CeRAM switch.

By reducing the voltage levels required for operation of the array, low power operation becomes possible and the necessary real estate required for peripheral circuitry decreases. Using only external compliance circuitry, we have observed a wide signal margin 250 of more than one order of magnitude for 3500 write/read cycles, as shown in FIG. 6. Additionally, the dispersion in the ON state resistance 256 and OFF state resistance 254 on average is less than one order of magnitude. Since the ON state resistance may depend on the accuracy at which the current is clamped off during a set operation, the dispersion in the ON state resistance is expected to show noticeable improvement with on-chip compliance. As a result, as devices are scaled down and compliance circuitry is integrated on silicon, ΔR, the difference between curves 256 and 254 should increase while simultaneously the dispersion in ON and OFF state resistances decrease.

Figure 7:
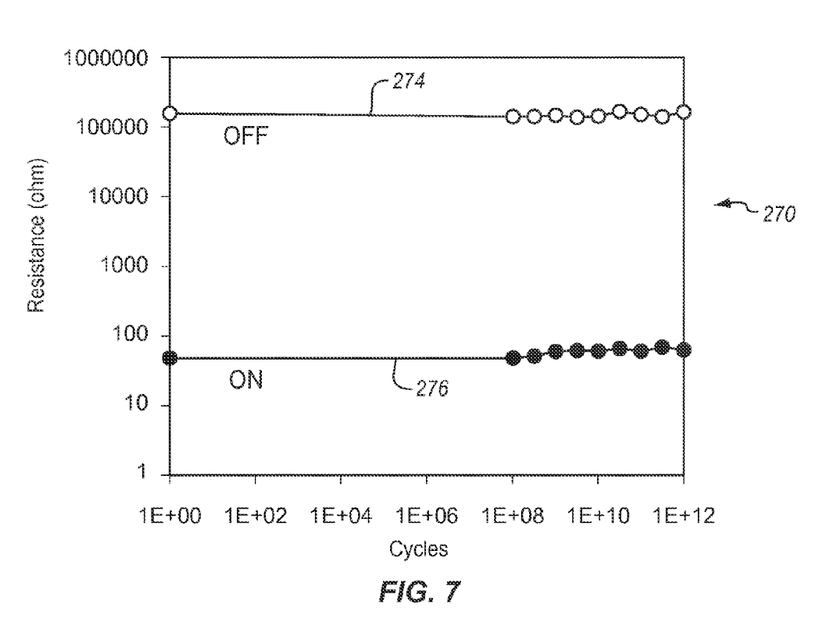
FIG. 7 shows an example of a graph of resistance versus number of cycles for a CeRAM switch for low voltage operation.

Low voltage cycling at the operational levels of the circuit shows no sign of degradation in the ON and OFF state resistances of the CeRAM switch out to 1012 cycles. Results are shown in FIG. 7 for a device tested at 25° C. using a 0.2V signal level. As seen in FIG. 7, the OFF state value 274 and ON state value 276 begin to show a small amount of scatter at $10^8$ cycles and are still essentially flat all the way out to $10^{12}$ cycles. In addition to the endurance characteristics, CeRAM switches exhibit a wide temperature range of reliable operation as well as state retention up to 300° C.

III. Modes of Operation

When characterizing the behavior of a CeRAM switch based re-programmable antifuse FPGA, there are two distinct cases to consider. The first case to consider is FPGA configuration. During configuration mode, the routing resources of the FPGA are assigned and the appropriate CeRAM switches are turned ON or OFF as necessary. The second case is that of normal FPGA operation. Typical operation requires that the assigned routes be accessible and the voltage levels across each CeRAM switch be low enough so as to not turn the switch off. Additionally, during operation, the CMOS Logic cells can be supplied with an appropriate Vdd for ultra-low power operation.

A. Configuration Mode

Figure 8:
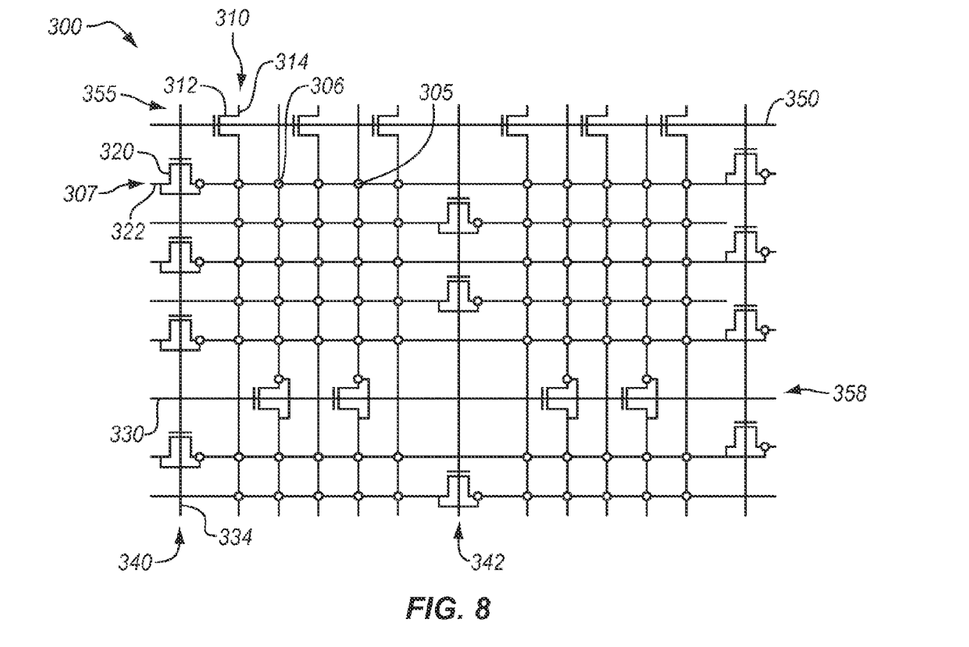
FIG. 8 illustrates an example of an interconnect architecture.
Figure 9:
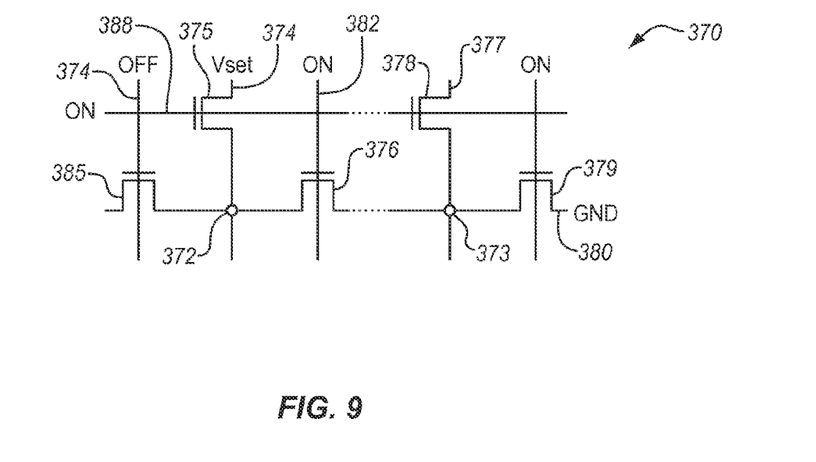
FIG. 9 illustrates one embodiment of programming a CeRAM switch at a crosspoint.

During configuration mode, all of the logic blocks in the FPGA are grounded out and we are only concerned with the routing resources in the chip. FIG. 8 shows a scaled down example of an FPGA interconnect system 300, with configuration transistors, such as 312 and 320. In this architecture, the logic blocks may lie below the CeRAM switches, but they are left out of the figure to emphasize only the routing resources. In one embodiment, rows, such as 307, and columns, such as 310, are organized such that the input and output nodes of the logic blocks connect to one segment, while other segments pass over the logic blocks without making contact. For larger scale architectures, the row and column segments would be set to pre-defined lengths and not allowed to span the entire array to maximize the number of logic connections. In configuration, dedicated logic included in the periphery of the FPGA circuit may be utilized to control the row and column configuration transistors, such as 320 and 310. These transistors allow access to each specific CeRAM switch, such as 306, so that it may be turned ON or OFF depending on the desired signal path. In the architecture of FIG. 8, the switches, such as 306, are configured into 5×5 blocks, such as 305. The switch blocks are separated by rows of transistors, such as 355 and 358, and by columns of transistors, such as 340 and 342. The rows of transistors are controlled by peripheral logic which controls, for example, row 355 of transistors by control line 350 and column 340 of transistors by control line 334. By default, all CeRAM switches are configured OFF and would only be turned back ON during re-configuration of the interconnect segments. To turn a specific CeRAM switch ON, for example, the transistors lying at the ends of the row and column that intersect at that switch will be turned on allowing voltage to pass through, while all others are off. For example, to turn on switch 306, transistors 414 and 320 would be turned on, with the input 322 to transistor 320 connected to ground while the input 314 of transistor 312 is connected to Vset. An example is shown in detail in FIG. 9. A portion of an array is shown at 370 having switches 372 and 373 and transistors 375, 378, 385, 376, and 379. To program switch 372, Vset is applied to input 374 of transistor 375, ground is applied to input 380 of transistor 379, and input 377 of transistor 378 is allowed to float. Control line 388 is on, turning transistors 375 and 378 ON, and control line 374 is off, turning transistor 385 OFF. This places a Vset voltage across switch 372, turning it ON, but leaves switch 373 in the OFF state.

As mentioned above, in addition to creating a specific path for the programming voltages, the transistors also can be biased such that they only allow a limited current to flow through, establishing the necessary current compliance for the CeRAM switch that is required for reliable switching behavior.

The order in which switches are turned ON may be determined in software in such a way that eliminates unwanted leakage paths during the configuration process. For re-configuration, the same transistors can be biased at a higher gate voltage to allow high enough current flow to turn the CeRAM switch OFF. Because an average application only utilizes roughly 4% of the routing resources in a given FPGA circuit, and the proposed architecture allows for simple re-routing around bad devices, combined with the fact that each individual switch can be re-programmed on the order of $10^3$ times, the versatility of these devices is nearly unlimited.

B. Operational Mode

During operational mode, the logic blocks are powered independently, and the signal lines may be kept at low voltage so that the inline CeRAM switches are not inadvertently re-programmed. In this mode, all configuration transistors are turned off and the configuration logic is grounded out. All of the appropriate segments have been properly configured, and the ultra-low power logic blocks are operational. To prevent undesired re-configuration of CeRAM switches during operational mode, all signal (Vsig) and clock voltages present in the routing resources have amplitude that is less than Vreset. For example, if Vsig were to exceed Vreset, then the voltage drop across a switch on a particular channel could exceed the voltage necessary to reset that switch, closing that signal path.

Figure 10:
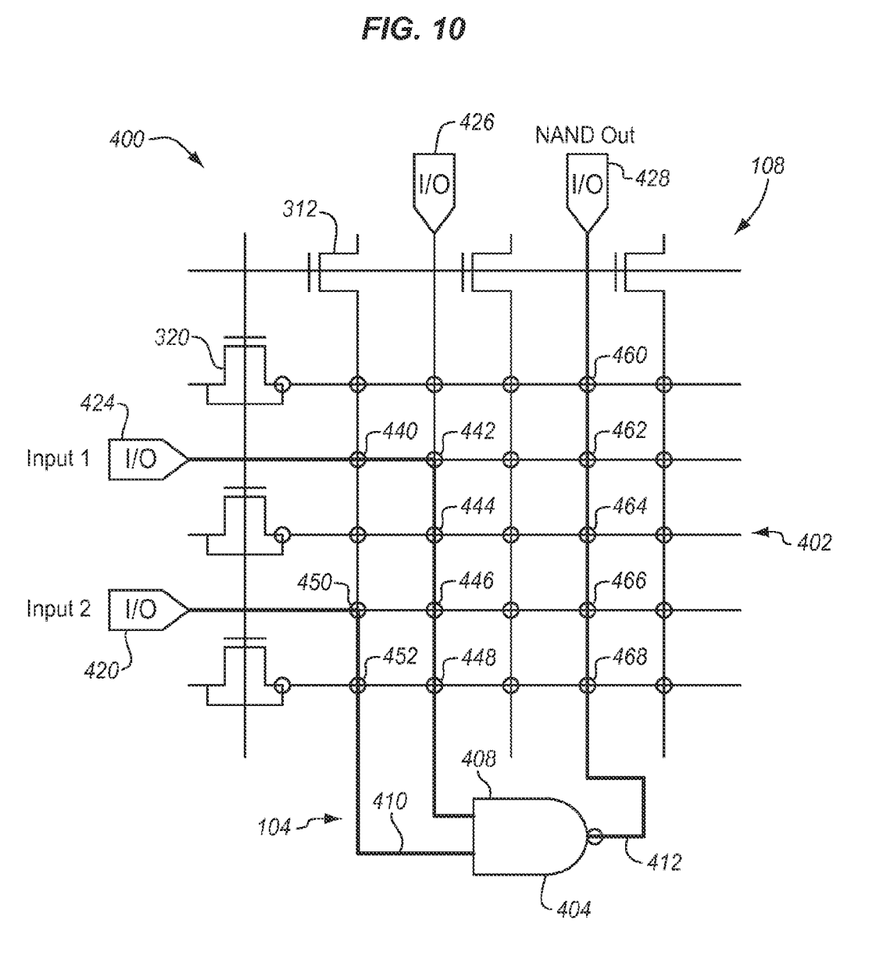
FIG. 10 illustrates an embodiment of programming a NAND gate in the memory of FIG. 1.

FIG. 10 shows an embodiment of a circuit 400 for programming a NAND gate 404 in the memory of FIG. 1 illustrating how the CeRAM module 108 interplays with the logic module 104 of FIG. 1. Circuit 400 includes a 5×5 array 402 of CeRAM switching elements, which may lie in the CeRAM module and a NAND gate 408 in the logic module 104.

As discussed above, array 402 overlies the logic 104 of which the NAND gate forms a part.

Array 402 includes switches 460, 440, 442, 462, 444, 464, 450, 446, 466, 452, 448, and 468. Circuit 400 includes input/output terminals 424, 420, 426, and 428, and transistors, such as 320. Input/output terminal 424 is connected to input terminal 409 of NAND gate 404 via switches 440, 442, 444, 446, and 448 which have been programmed ON in the manner discussed above. Input/output terminal 420 is connected to input terminal 410 of NAND gate 404 via switches 450 and 452 which have been programmed ON in the manner discussed above. Input/output terminal 428 is connected to NAND output 412 via switches 468, 466, 464, 462, and 460, which have been programmed ON as discussed above. The other switches of array 402 are programmed OFF. The paths between terminals 424, 420, and 428 and the terminals 408, 410, and 412 of NAND gate 404 are shown in a thicker line so as to make it easier to follow the paths.

Figure 11:
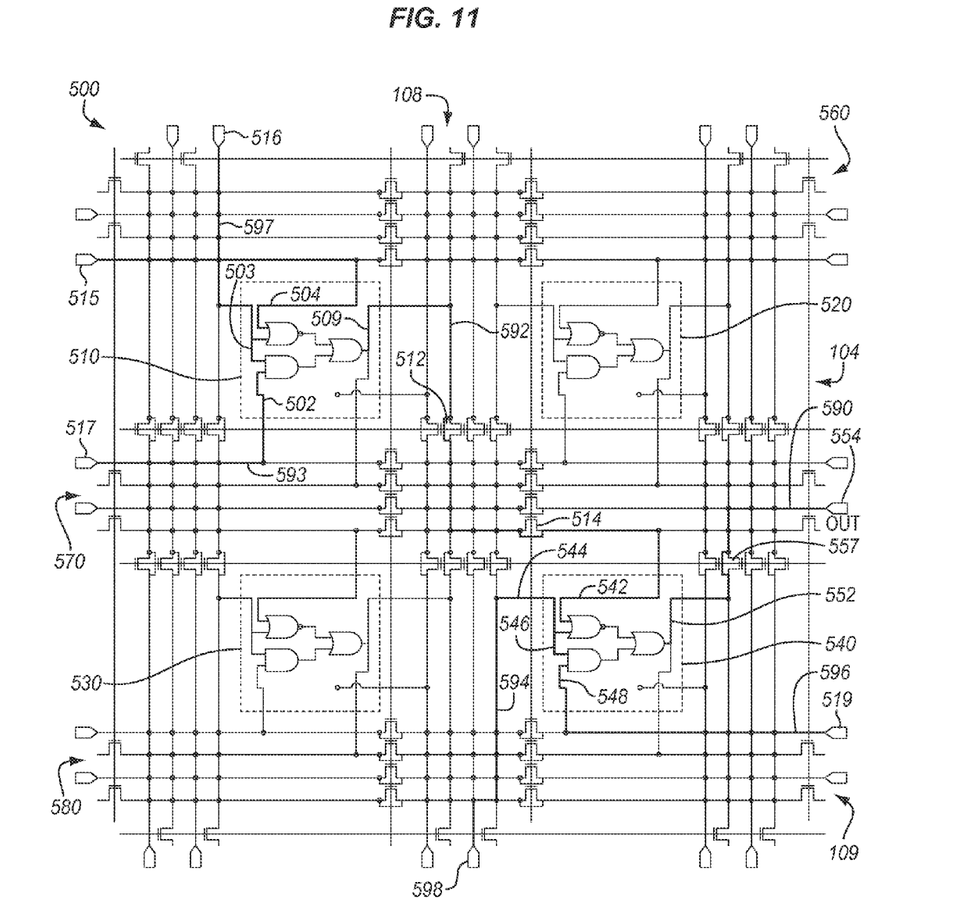
FIG. 11 shows an embodiment in which a first logic element provides input to a second logic element illustrating how logic elements can be chained together to produce a great variety of integrated circuit architectures.

FIG. 11 shows an embodiment or a circuit 500 in which the output 509 of a first logic element 510 provides an input 542 to a second logic element 540 illustrating how logic elements can be chained together to produce a great variety of integrated circuit architectures. Circuit 500 includes logic elements 510, 520, 530, and 540, input/outputs 515, 516, 517, 519, 544, and 558, transistors 512, 514, and 557, and switch arrays 560, 570, and 580. As discussed above, the logic elements 510, 520, 530, and 540 may be in a logic layer 104, while the arrays may be in another layer 108. In one embodiment, the arrays 560 may be in a metallization layer 108, while the arrays 580 are in a different metallization layer 109. Likewise, the logic elements 510, 520, 530, and 540 may lie in different logic layers. In one embodiment, inputs 503 and 504 of logic element 510 are connected to input/outputs 515 and 516 via path 597, while input 502 is connected to input 517 via path 593. The output 509 of logic element 510 is connected to the input 542 of logic element 540 via transistors 512 and 514 via path 592. Inputs 546 of logic element 540 are connected to input/output 558 via six CeRAM switch elements in path 594, and input 548 of logic element 540 is connected to input/output 519 via path 596. Output 552 of logic element 540 is connected to output 554 via transistor 557 and a plurality of switch elements via path 590. Similarly, many other logic circuits can be constructed by using various CeRAM switches and transistors to make connections.

Figure 12:
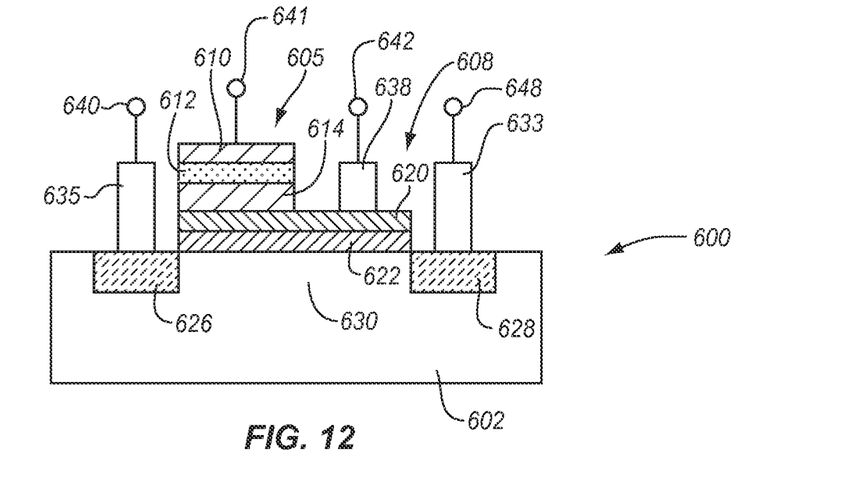
FIG. 12 shows a simplified cross-sectional view illustrating one embodiment of a split gate CeRAM memory cell.

FIG. 12 shows a simplified cross-sectional view illustrating one embodiment 600 of a split gate CeRAM memory cell. Cell 600 is formed on a semiconductor 602 and includes CeRAM resistive switching element 605 and transistor 608. CeRAM element 605 includes electrodes 610 and 614 sandwiching CeRAM layer 612. Transistor 605 includes gate/base 520, oxide layer 622, and source/drains/emitters 626 and 628. Plugs 635 and 633 contact source/drains/emitters 626 and 628, with channel 630 between them. Plug 638 contacts gate 620. CeRAM element 605 is stacked atop the transistor gate/base covering only a portion of the contact so that the plug 638 can still be extended to the gate allowing direct contact to the gate/base as well as bottom electrode contact of the CeRAM element 605. Electrical wiring terminals 640, 641, 642, and 648 apply power to cell 600.

Figure 13:
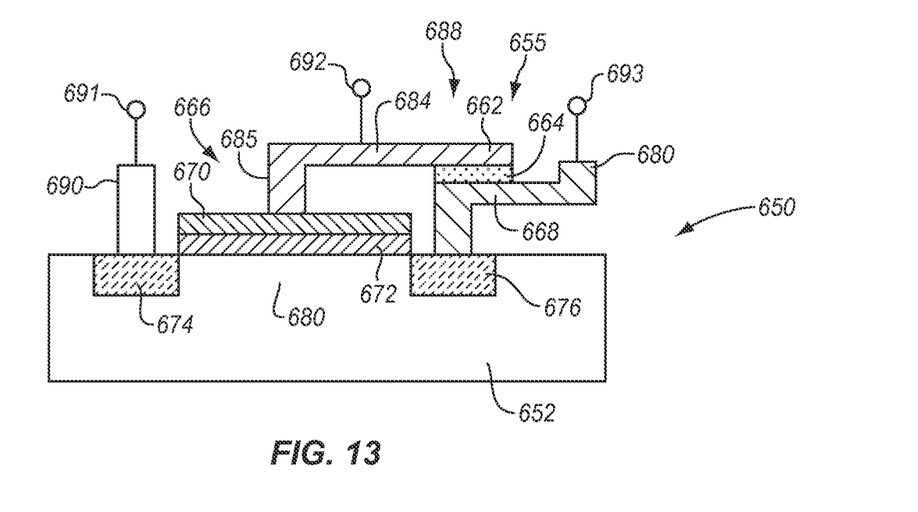
FIG. 13 shows a simplified cross-sectional view illustrating an embodiment of a CeRAM element incorporated into a gate-source/base-emitter connection of an active CMOS resistor configuration.

FIG. 13 show a simplified cross-sectional view illustrating an embodiment 650 of a CeRAM element 655 incorporated into a gate-source/base-emitter connection 688 of an active CMOS resistor configuration. Cell 650 is formed on a semiconductor 652, and includes CeRAM resistive switching element 655, transistor 666, and connection 688. Transistor 666 comprises gate 670, oxide layer 672, and source/drains emitters 674 and 676 with channel 680 between them. CeRAM element 655 includes bottom electrode 668 which has an upturned contact portion 680 and a post 689 which contacts one source/drain emitter 676 of transistor 666. CeRAM 688 also includes top electrode 662 with an extension 684 over transistor 666 that extends to a downward leg 685 which forms a contact to transistor gate 670. A plug 690 makes contact with source/drain emitter 674. Electrical wiring terminals 690, 692, and 693 apply power to cell 600.

Because of the low voltage levels (Vsig≈200-300 mV), the logic blocks may be designed for ultra-low power operation which, at the 65 nm technology node and below, can detect input voltages just above 120 mV as a logic 1. For larger technology nodes, it is still possible to use low signal levels on the routing channels; however, in the minimum VHI>Vsig, a buffer amplifier may be included on the input channels of the logic blocks to bring the voltage level above the minimum required to sense a logic 1. With this in mind, it is possible to use re-configurable CeRAM switches in crossbar antifuse architectures for both mature and state of the art technology nodes.

In one embodiment, there is a re-programmable antifuse field programmable gate array (FPGA) integrated circuit, the FPGA comprising: a power source; a plurality of CeRAM resistive switching elements forming a connection block, the switching elements capable of being switched from a conductive (ON) state to a non-conductive (OFF) state and back to a conductive (ON) state; a plurality of logic elements forming a logic block; a plurality of transistors forming a switching block; the transistors connected between the power source and the CeRAM resistive elements; a control circuit for applying control pulses to the transistors; and a microprocessor connected to the control circuit for turning the CeRAM switching elements OFF and ON to connect the logic elements to form the FPGA. In one alternative, the connection block is formed in one or more wiring layers above the logic block. In another alternative, the transistors are current-limited transistors. In one alternative, the logic block is a CMOS logic block. In another embodiment, the FPGA further includes CMOS memory elements in the CMOS logic block. In an alternative, the FPGA further includes a plurality of metal/insulator/metal (MIM) memory elements in the layer including the CeRAM switching elements. In another embodiment, the switching block is formed in the same layer or layers as the connection block. In a further embodiment, the CeRAM switching elements comprise nickel oxide (NiO) or any suitable transition metal oxide, such as those mentioned in U.S. Pat. No. 7,872,900 referenced above. In a further alternative, the CeRAM resistive switching elements are capable of being switched $10^{10}$ times with less than 25% change in the resistance of the ON state and the OFF state. In another alternative, the CeRAM resistive switching elements are capable of being switched $10^{10}$ times with less than 10% change in the resistance of the ON state and the OFF state. In an alternative embodiment, the CeRAM resistive switching elements are formed in a crossbar architecture.

In another embodiment, there is a method of forming a first Field Programmable Gate Array (FPGA), the method comprising: providing a plurality of CeRAM resistive switching elements, the switching elements capable of being switched from a conductive state to a non-conductive state and back to a conductive state; and a plurality of logic elements; and programming the CeRAM switching elements to be ON or OFF to connect one or more of the logic elements to form the FPGA. In one embodiment, the programming comprises applying a voltage to one or more of the CeRAM switching elements while limiting the current applied to the switching elements. In an alternative, the current is 5 milliamps (mA) or less. In another alternative, the current is 2 mA or less. In another alternative, the voltage is 2 volts or less. In one embodiment, limiting the current comprises applying the voltage through a current limited transistor. In another embodiment, limiting the current comprises saturating the transistor. In an alternative, the method further comprises reprogramming the CeRAM switching elements to form a second FPGA different than the first FPGA. In another embodiment, the method comprises operating the FPGA with a voltage signal of two volts or less. In a further embodiment, the method further comprises operating the FPGA with a voltage signal of 1 volt or less. In another embodiment, the method further comprises operating the FPGA with a current of one-half volt or less.

In another embodiment, there is a re-programmable antifuse field programmable gate array (FPGA) integrated circuit, the FPGA comprising: a plurality of CeRAM resistive switching elements forming a connection block, the switching elements capable of being switched from a conductive (ON) state to a non-conductive (OFF) state and back to a conductive (ON) state; and a plurality of logic elements forming a logic block; and a programming circuit for turning the CeRAM switching elements OFF and ON to connect the logic elements to form the FPGA. In one alternative, the CeRAM switching elements comprise nickel oxide (NiO). In another alternative, the CeRAM resistive switching elements are capable of being switched $10^{10}$ times with less than 25% change in the resistance of the ON state and the OFF state. In another embodiment, the CeRAM resistive switching elements are capable of being switched $10^{10}$ times with less than 10% change in the resistance of the ON state and the OFF state. In a further embodiment, the CeRAM resistive switching elements are formed in a crossbar architecture. In a further embodiment, the FPGA is capable of being operated with a voltage of 2 volts or less.

There have been described novel switching and memory methods, systems, and devices. Now that embodiments have been described, those skilled in the art will be able to adapt them to other switching and memory methods, systems, and devices. It will also be evident to those skilled in the art that the various parts of the embodiments may be combined in many different ways. It should be understood that each of the processes and apparati described can be combined with any of the other processes and apparati. After review of this disclosure, additional advantages and modifications will readily appear to those skilled in the art.

What is claimed is:

1. A re-programmable antifuse field programmable gate array (FPGA) integrated circuit, said FPGA comprising:
   a power source;
   a plurality of CeRAM resistive switching elements forming a connection block, said switching elements capable of being switched from a conductive (ON) state to a non-conductive (OFF) state and back to a conductive (ON) state;
   a plurality of logic elements forming a logic block;
   a plurality of transistors forming a switching block;
   said transistors connected between said power source and said CeRAM resistive elements;
   a control circuit for applying control pulses to said transistors; and
   a microprocessor connected to said control circuit for turning said CeRAM switching elements OFF and ON to connect said logic elements to form said FPGA.

2. An FPGA as in claim 1 wherein said connection block is formed in one or more wiring layers above said logic block.

3. An FPGA as in claim 1 wherein said transistors are current-limited transistors.

4. An FPGA as in claim 1 wherein said logic block is a CMOS logic block.

5. An FPGA as in claim 4, and further including CMOS memory elements in said CMOS logic block.

6. An FPGA as in claim 2, and further including a plurality of metal/insulator/metal (MIM) memory elements in said layer including said CeRAM switching elements.

7. An FPGA as in claim 1 wherein said switching block is formed in the same layer or layers as said connection block.

8. An FPGA as in claim 1 wherein said CeRAM switching elements comprise nickel oxide (NiO) or other transition metal oxide.

9. An FPGA as in claim 1 wherein said CeRAM resistive switching elements are capable of being switched $10^{10}$ times with less than 25% change in the resistance of the ON state and the OFF state.

10. An FPGA as in claim 1 wherein said CeRAM resistive switching elements are capable of being switched $10^{10}$ times with less than 10% change in the resistance of the ON state and the OFF state.

11. An FPGA as in claim 1 wherein said CeRAM resistive switching elements are formed in a crossbar architecture.

12. A method of forming a first Field Programmable Gate Array (FPGA), said method comprising:
   providing a plurality of CeRAM resistive switching elements, said switching elements capable of being switched from a conductive state to a non-conductive state and back to a conductive state; and a plurality of logic elements; and programming said CeRAM switching elements to be ON or OFF to connect one or more of said logic elements to form said FPGA.

13. A method as in claim 12 wherein said programming comprises applying a voltage to one or more of said CeRAM switching elements while limiting the current applied to said switching elements.

14. A method as in claim 13 wherein said current is 5 milliamps (mA) or less.

15. A method as in claim 13 wherein said current is 2 mA or less.

16. A method as in claim 13 wherein said voltage is 2 volts or less.

17. A method as in claim 13 wherein said limiting the current comprises applying said voltage through a current-limited transistor.

18. A method as in claim 17 wherein said limiting the current comprises saturating said transistor.

19. A method as in claim 12, and further comprising reprogramming said CeRAM switching elements to form a second FPGA different than said first FPGA.

20. A method as in claim 12, and further comprising operating said FPGA with a voltage signal of two volts or less.

21. A method as in claim 12, and further comprising operating said FPGA with a voltage signal of 1 volt or less.

22. A method as in claim 12, and further comprising operating said FPGA with a current of one-half volt or less.

23. A re-programmable antifuse field programmable gate array (FPGA) integrated circuit, said FPGA comprising:
- a plurality of CeRAM resistive switching elements forming a connection block, said switching elements capable of being switched from a conductive (ON) state to a non-conductive (OFF) state and back to a conductive (ON) state;
- a plurality of logic elements forming a logic block; and
- a programming circuit for turning said CeRAM switching elements OFF and ON to connect said logic elements to form said FPGA.

24. An FPGA as in claim 23 wherein said CeRAM switching elements comprise nickel oxide (NiO).

25. An FPGA as in claim 23 wherein said CeRAM resistive switching elements are capable of being switched $10^{10}$ times with less than 25% change in the resistance of the ON state and the OFF state.

26. An FPGA as in claim 23 wherein said CeRAM resistive switching elements are capable of being switched $10^{10}$ times with less than 10% change in the resistance of the ON state and the OFF state.

27. An FPGA as in claim 23 wherein said CeRAM resistive switching elements are formed in a crossbar architecture.

28. An FPGA as in claim 23 wherein said FPGA is capable of being operated with a voltage of 2 volts or less.

* * * * *